(12) United States Patent
Jung et al.

(10) Patent No.: US 11,997,403 B2
(45) Date of Patent: May 28, 2024

(54) IMAGE SENSOR, A PIXEL AND AN OPERATING METHOD OF THE IMAGE SENSOR

(71) Applicant: SAMSUNG ELECTRONICS CO., LTD., Suwon-si (KR)

(72) Inventors: Taesub Jung, Hwaseong-si (KR); Kyungho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 103 days.

(21) Appl. No.: 17/583,504

(22) Filed: Jan. 25, 2022

(65) Prior Publication Data

US 2022/0239854 A1 Jul. 28, 2022

(30) Foreign Application Priority Data

Jan. 27, 2021 (KR) .................... 10-2021-0011801

(51) Int. Cl.
*H04N 25/63* (2023.01)
*H01L 27/146* (2006.01)
*H04N 25/709* (2023.01)
*H04N 25/76* (2023.01)

(52) U.S. Cl.
CPC ........... *H04N 25/63* (2023.01); *H04N 25/709* (2023.01); *H01L 27/14621* (2013.01); *H01L 27/14627* (2013.01); *H01L 27/1463* (2013.01); *H01L 27/14645* (2013.01); *H04N 25/76* (2023.01)

(58) Field of Classification Search
CPC ...... H04N 25/63; H04N 25/709; H04N 25/76; H04N 25/74; H04N 25/79; H04N 25/59; H04N 25/766; H04N 25/745; H04N 25/75; H04N 25/531; H04N 25/77; H04N 25/771; H01L 27/14621; H01L 27/14627; H01L 27/1463; H01L 27/14645; H01L 27/1461; H01L 27/14609; H01L 27/14614; H01L 27/14623; H01L 27/14643

See application file for complete search history.

(56) References Cited

U.S. PATENT DOCUMENTS

| 7,787,038 | B2 | 8/2010 | Mabuchi |
| 7,902,574 | B2 | 3/2011 | Adachi |
| 8,823,069 | B2 | 9/2014 | Koga |
| 9,054,007 | B2 | 6/2015 | Hu et al. |
| 9,860,467 | B2 | 1/2018 | Kim et al. |
| 2015/0070553 | A1* | 3/2015 | Lee ......................... H04N 25/75 348/308 |
| 2017/0271384 | A1* | 9/2017 | Zheng ............... H01L 27/14623 |

FOREIGN PATENT DOCUMENTS

JP 2006-345277 12/2006

* cited by examiner

*Primary Examiner* — Lin Ye
*Assistant Examiner* — Tuan H Le
(74) *Attorney, Agent, or Firm* — F. Chau & Associates, LLC

(57) ABSTRACT

An image sensor including: a pixel array including a plurality of pixels and a row driver configured to drive the pixel array, wherein each of the plurality of pixels includes at least one photodiode, a transmission transistor, a selection transistor, a device isolation structure, and a bulk area, and the row driver is configured to adjust, for each of preset periods, sizes and application timings of a negative voltage applied to the device isolation structure and a bulk control voltage applied to the bulk area while a first pixel is driven.

18 Claims, 14 Drawing Sheets

IMAGE SENSOR, A PIXEL AND AN OPERATING METHOD OF THE IMAGE SENSOR

CROSS-REFERENCE TO RELATED APPLICATION

This application claims priority under 35 U.S.C. § 119 to Korean Patent Application No. 10-2021-0011801, filed on Jan. 27, 2021, in the Korean Intellectual Property Office, the disclosure of which is incorporated by reference herein in its entirety.

TECHNICAL FIELD

The inventive concept relates to an image sensor, a pixel, and an operating method of the image sensor, and more particularly, to an image sensor for restricting the generation of a dark current and a leakage current, a pixel, and an operating method of the image sensor.

DISCUSSION OF RELATED ART

An image sensor is a device for capturing two-dimensional or three-dimensional images of an object. In other words, the image sensor detects and conveys information used to make an image. The image sensor generates images of the object by using a photoelectric transformation element that reacts to the intensity of light reflected from the object. The image sensor may employ a Complementary Metal-Oxide Semiconductor (CMOS) image sensor, which is relatively cheap and has low power consumption. However, as the CMOS image sensor operates, noise may be generated from devices in the CMOS image sensor.

SUMMARY

Embodiments of the inventive concept provide an image sensor that adjusts a timing of a negative voltage applied to a bulk of a pixel to restrict a dark current (or a dark level) when a low voltage is applied to a pixel, the pixel, and an operating method of the image sensor.

Embodiments of the inventive concept also provide a sensor, which restricts a dark current and reduces a leakage current of a transistor included in a pixel, the pixel, and an operating method of the image sensor.

The image sensor according to an embodiment of the inventive concept includes a pixel array including pixels and a row driver for driving the pixel array. Each pixel may include at least one photodiode, a transmission transistor, a selection transistor, a device isolation structure, and a bulk area. The row driver is configured to adjust, for each of preset periods, sizes and application timings of a negative voltage applied to the device isolation structure and a bulk control voltage applied to the bulk area while the at least one photodiode of the pixel is initialized during driving of the pixel, a plurality of photo-charges are accumulated in the at least one photodiode, and the plurality of accumulated photo-charges are read.

According to an embodiment of the inventive concept, there is provided an image sensor including: a pixel array including a plurality of pixels and a row driver configured to drive the pixel array, wherein each of the plurality of pixels includes at least one photodiode, a transmission transistor, a selection transistor, a device isolation structure, and a bulk area, and the row driver is configured to adjust, for each of preset periods, sizes and application timings of a negative voltage applied to the device isolation structure and a bulk control voltage applied to the bulk area while a first pixel is driven.

According to an embodiment of the inventive concept, there is provided a pixel including: at least one photodiode, a transmission transistor, and a selection transistor, wherein a first bulk control voltage is applied to a first terminal of the at least one photodiode in an operation cycle including a readout operation, and a second bulk control voltage is applied to the first terminal of the at least one photodiode in a vertical blank period in which a plurality of photo-charges are accumulated in the at least one photodiode.

According to an embodiment of the inventive concept, there is provided an operating method of an image sensor, the operating method including: applying a first bulk control voltage to a bulk area in a first period in which a photodiode of a pixel is initialized, wherein the first bulk control voltage has a negative voltage level and controls a negative voltage level applied to a device isolation structure and a voltage level applied to the bulk area in the pixel; applying a second bulk control voltage to the bulk area in a second period in which a plurality of photo-charges are accumulated in the photodiode; and applying the first bulk control voltage to the bulk area in a third period in which a signal of the pixel is output.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, one or more embodiments of the inventive concept will be described in detail with reference to the attached drawings.

Figure 1:
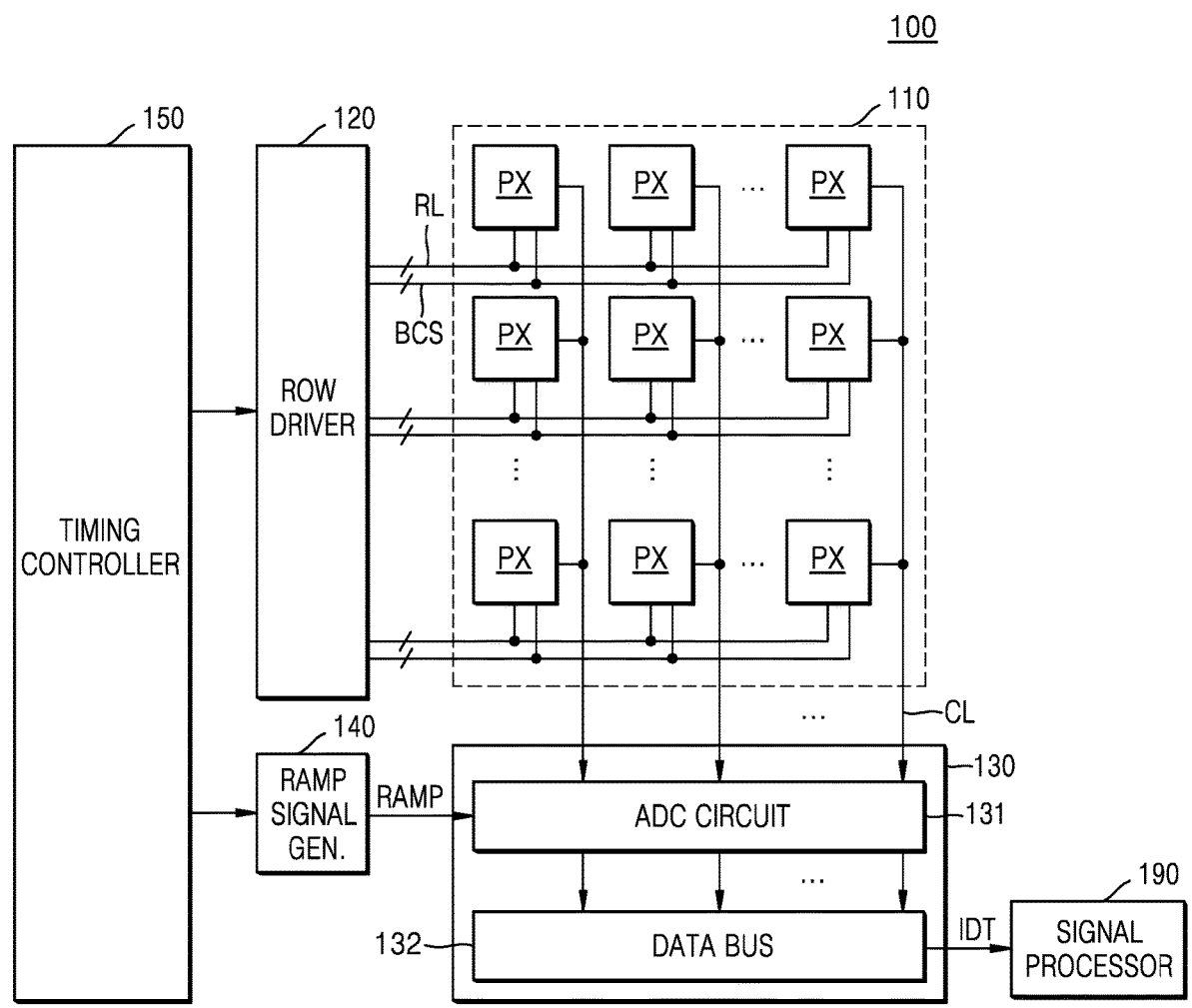
FIG. 1 is a block diagram of an image sensor according to an embodiment of the inventive concept.

FIG. 1 is a block diagram of an image sensor according to an embodiment of the inventive concept.

An image sensor 100 may be mounted on an electronic device having an image sensing function or an optical sensing function. For example, the image sensor 100 may be mounted on an electronic device such as a camera, a smartphone, a wearable device, an Internet of Things (IoT) device, home appliances, a tablet Personal Computer (PC), a Personal Digital Assistant (PDA), a portable Multimedia Player (PMP), a navigation device, a drone, or an Advanced Driver Assistance System (ADAS). In addition, the image sensor 100 may be mounted on electronic devices included, as a component, in vehicles, furniture, manufacturing facilities, doors, various measurement devices, or the like.

Referring to FIG. 1, the image sensor 100 may include a pixel array 110, a row driver 120, a readout circuit 130, a ramp signal generator 140, a timing controller 150, and a signal processor 190. The readout circuit 130 may include an analog-digital conversion (ADC) circuit 131, and a data bus 132.

The pixel array 110 includes pixels PX arranged in a matrix and row lines RL and column lines CL that are connected to the pixels PX. The row lines RL may be scan signal lines and the column lines CL may be data signal lines. A bulk control voltage BCS may be included in and provided through the row line RL or may be provided through a separate signal line. For example, the bulk control voltage BCS may be provided through a dedicated signal line.

Figure 2:
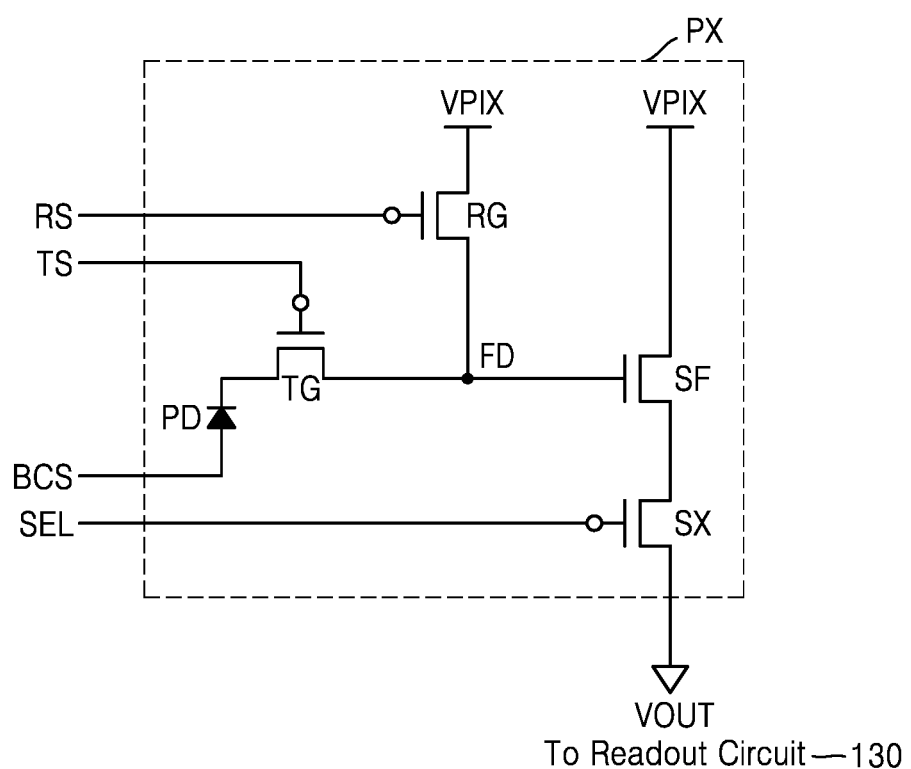
FIG. 2 is a circuit diagram of a pixel according to an embodiment of the inventive concept.

The row lines RL may extend in a row direction and may be connected to the pixels PX arranged in the same row, respectively. For example, as shown in FIG. 2, row lines RL may respectively transmit, to transistors of a pixel circuit, control signals that are output from the row driver 120.

Each pixel PX according to an embodiment of the inventive concept may include at least one photoelectric transformation element (or a light detection element). The photoelectric transformation element may detect light and may transform the detected light into photo-charges. For example, the photoelectric transformation element may be a light detection element, such as, an inorganic photodiode, an organic photodiode, a perovskite photodiode, a phototransistor, a photogate, or a pinned photodiode, which includes organic or inorganic materials. In an embodiment of the inventive concept, the pixels PX may each include the photoelectric transformation elements.

A micro-lens for collecting light may be arranged on an upper portion of each pixel PX or an upper portion of each pixel group including adjacent pixels PX. Each pixel PX may detect light in a certain spectral range from light received through the micro-lens. For example, the pixel array 110 may include a red pixel that transforms light in a red spectral range into an electrical signal, a green pixel that transforms light in a green spectral range into an electrical signal, and a blue pixel that transforms light in a blue spectral range into an electrical signal. On the upper portion of each pixel PX, a color filter for penetrating light in a certain spectral range may be arranged. However, the inventive concept is not limited thereto. The pixel array 110 may include pixels that transform, into electrical signals, light in spectral ranges other than the red, green, and blue spectral ranges.

In an embodiment of the inventive concept, the pixels PX may have a multilayered structure. The pixel PX having the multilayered structure may include photoelectric transformation elements that are stacked and transform light in different spectral ranges into electrical signals, and electrical signals corresponding to different colors may be generated from these multilayered photoelectric transformation elements. In other words, electrical signals corresponding to multiple colors may be output from one pixel PX.

A color filter array for penetrating light in a certain spectral range may be arranged on the upper portions of the pixels PX, and according to the color filters respectively arranged on the upper portions of the pixels PX, colors that the corresponding pixels PX may detect may be determined. However, the inventive concept is not limited thereto. For example, in the case of a certain photoelectric transformation element, light in a certain wavelength band may be transformed into electrical signals according to levels of the electrical signals transmitted to the photoelectric transformation element.

Each column line CL may extend in a column direction and may be connected to the pixels PX arranged in the same column. Each column line CL may transmit reset signals and sensing signals of the pixels PX to the readout circuit 130 in row units of the pixel array 110.

The timing controller 150 may control timings of the row driver 120, the readout circuit 130, and the ramp signal generator 140. Timing signals indicating operation timings may be respectively provided to the row driver 120, the readout circuit 130, and the ramp signal generator 140 from the timing controller 150.

The row driver 120 may generate control signals for driving the pixel array 110 and may respectively provide the control signals to the pixels PX of the pixel array 110 through the row lines RL, under the control of the timing controller 150. The row driver 120 may control the pixels PX of the pixel array 110 to detect light incident to the pixels PX simultaneously or in row units. In addition, the row driver 120 may select pixels PX from among the pixels PX in row units and may control the selected pixels PX (e.g., pixels PX in one row) to output reset signals and sensing signals through the column lines CL.

The ramp signal generator 140 may generate ramp signals RAMP that increase or decrease in a certain gradient and may provide the ramp signals RAMP to the ADC circuit 131 of the readout circuit 130.

The readout circuit 130 may read reset signals and sensing signals from the pixels PX in the row selected by the row driver 120 from among the pixels PX. The readout circuit 130 may convert the reset signals and the sensing signals, which are received from the pixel array 110 through the column lines CL, into digital data according to the ramp signals RAMP from the ramp signal generator 140, and thus, may generate and output pixel values corresponding to the pixels PX in row units.

The ADC circuit 131 may include ADCs respectively corresponding to the column lines CL, and each ADC may compare a reset signal and a sensing signal, which are received through a corresponding column line CL, to a ramp signal RAMP and may generate a pixel value corresponding to each comparison result. For example, the ADC may remove the reset signal from the sensing signal and may generate a pixel value indicating the amount of light detected from the pixel PX.

The pixel values generated from the ADC circuit 131 may be output as image data IDT through the data bus 132. For example, the image data IDT may be provided to an image signal processor inside or outside the image sensor 100. For example, the image data IDT may be provided to the signal processor 190.

The data bus 132 may temporarily store the pixel values output from the ADC circuit 131 and may output the pixel values. The data bus 132 may include column memories and a column decoder. Pixel values stored in the column memories may be output as the image data IDT under the control of the column decoder.

The ADC circuit 131 may include Correlated Double Sampling (CDS) circuits and counter circuits. The ADC circuit 131 may convert a pixel signal (e.g., a pixel voltage), which is input from the pixel array 110, into a pixel value that is a digital signal. Each pixel signal received through each column line CL is converted into the pixel value, which is the digital signal, by the CDS circuit and the counter circuit.

The signal processor 190 may perform, on the image data IDT, noise reduction processing, gain adjustment, waveform shaping, interpolation, white balance processing, gamma processing, edge enhancement, binning, and the like.

The row driver 120 may provide the bulk control voltage BCS to each pixel PX of the pixel array 110 through each row line RL or a signal line other than the row line RL. In the present embodiment, the row driver 120 may generate and provide the bulk control voltage BCS, but the inventive concept is not limited thereto. The bulk control voltage BCS may be generated and provided by another circuit of the image sensor.

The bulk control voltage BCS may be a signal provided to a P-WELL area through a first terminal C of a photodiode PD of FIG. 2. The first terminal C may be a terminal at which a photodiode is connected to the bulk control voltage BCS instead of ground. The P-WELL area is referred to as a bulk and may be commonly connected to the photodiode PD and bodies of transistors in all pixels PX. The pixels PX may output the generated pixel signals to the column lines CL, respectively.

The bulk control voltage BCS may be a negative voltage or 0 V or may have different voltage levels. A threshold voltage of a transmission transistor (e.g., a transmission transistor TG of FIG. 2) included in each pixel PX may be changed according to a level of the bulk control voltage BCS. Such a change may result from a body effect. When a bulk control voltage BCS having a negative level is applied to each pixel PX, the threshold voltage of the transmission transistor included in each pixel PX may be higher than when a bulk control voltage BCS of 0 V is applied to each pixel PX. In the alternative, when a bulk control voltage BCS having a positive level is applied to each pixel PX, the threshold voltage of the transmission transistor may be lower than when the bulk control voltage BCS of 0 V is applied to each pixel PX. When the bulk control voltage BCS having a negative level is applied to each pixel PX and the threshold voltage of the transmission transistor increases, a potential of a gate of the transmission transistor decreases, and thus, Full Well Capacity (FWC) increases. In the alternative, when the bulk control voltage BCS having a positive level is applied to each pixel PX and the threshold voltage of the transmission transistor decreases, the potential of the gate of the transmission transistor increases, and thus, the FWC decreases.

The FWC indicates the number of photo-charges that may be accumulated in the photodiode PD, and as the FWC increases, a pixel may have a better high-illumination signal-to-noise ratio and dynamic range.

In addition, the threshold voltage of the transmission transistor may be associated with features of a dark current. A dark current is a phenomenon in which an output signal of a certain degree is generated even when light is weak or no light enters because of defects, etc. in a substrate. A dark current phenomenon may increase as the potential of the gate of the transmission transistor decreases. When the bulk control voltage BCS having a negative level is applied to each pixel PX and the threshold voltage of the transmission transistor increases, the potential of the gate of the transmission transistor decreases, and thus, the dark current increases. In the alternative, when the bulk control voltage BCS having a positive level is applied to each pixel PX and the threshold voltage of the transmission transistor decreases, the potential of the gate of the transmission transistor increases, and thus, the dark current decreases.

However, as described above, when the bulk control voltage BCS having a positive level is applied to the pixels PX, a well capacitance may decrease, the leakage current in the selection transistor may increase, the charges accumulated in the photodiode PD may remain, and the efficiency of transmitting the charges from the photodiode PD to the floating diffusion node may decrease.

The image sensor 100 according to an embodiment of the inventive concept may reduce the generation of the dark current during a period in which the charges are accumulated in the photodiode PD by adjusting a level and a timing of the bulk control voltage BCS as described above and may prevent the charges accumulated in the photodiode PD from remaining or the occurrence of the leakage current in the selection transistor when the transmission transistor and the selection transistor are driven.

FIG. 2 is a circuit diagram of a pixel, according to an embodiment of the inventive concept.

Referring to FIGS. 1 and 2, the pixel PX may include at least one photodiode PD, a transmission transistor TG, a reset transistor RG, a driving transistor SF, and a selection transistor SX. FIG. 2 illustrates an example of a pixel having a 4T structure including one photodiode PD and four MOS transistors (the transmission transistor TG, the reset transistor RG, the driving transistor SF, and the selection transistor SX). However, the inventive concept is not limited thereto. For example, the inventive concept may be applied to all circuits including at least three transistors and at least one photodiode PD.

The photodiode PD may convert light incident from the outside into an electrical signal. The photodiode PD generates charges according to light intensity. The number of charges generated by the photodiode PD varies according to an image capturing environment (e.g., low illumination or high illumination). For example, the number of charges generated by the photodiode PD may reach the FWC of the photodiode PD in a high-illumination environment, but may not reach the FWC of the photodiode PD in a low-illumination environment. An end of the photodiode PD may be connected to the transmission transistor TG, and the first terminal C, which is the other end of the photodiode PD, may receive the bulk control voltage BCS from the row driver 120.

The reset transistor RG may be turned on in response to a reset control signal RS transmitted to a gate terminal of the reset transistor RG and may reset a floating diffusion node FD according to a pixel voltage VPIX.

The transmission transistor TG may be turned on in response to a transmission control signal TS transmitted to a gate terminal of the transmission transistor TG and may transmit charges generated by the photodiode PD to the floating diffusion node FD. In the floating diffusion node FD, the transmitted charges may be accumulated. In other words, the charges may be accumulated in a capacitor formed in the floating diffusion node FD.

The driving transistor SF may function as a source follower according to a bias current generated by a current source connected to the column line CL and may output a voltage corresponding to a voltage of the floating diffusion node FD through the selection transistor SX.

The selection transistor SX may select a pixel PX. The selection transistor SX may be turned on in response to a selection control signal SEL transmitted to a gate electrode of the selection transistor SX and may output, to the column line CL, a voltage (or a current) output from the driving transistor SF.

A second voltage (e.g., 2.2 V) that is lower than a first voltage (e.g., 2.8 V) may be applied as the pixel voltage VPIX. When the first voltage is applied as the pixel voltage VPIX, the first terminal C of the photodiode PD may be grounded, and when the second voltage is applied as the pixel voltage VPIX, the first terminal C of the photodiode PD may be connected to the bulk control voltage BCS. 0 V or a voltage (e.g., −0.6 V), which corresponds to a difference between the second voltage and the first voltage, may be applied to the first terminal C of the photodiode PD as the bulk control voltage BCS.

When the second voltage is applied as the pixel voltage VPIX instead of the first voltage, the bulk control voltage BCS, which corresponds to a difference between the second voltage and the first voltage, is connected to the photodiode PD instead of the ground, and an effect of applying the same voltage to the pixels PX may be obtained. In other words, a uniform voltage may be applied to the pixels PX by using the bulk control voltage BCS.

Figure 3:
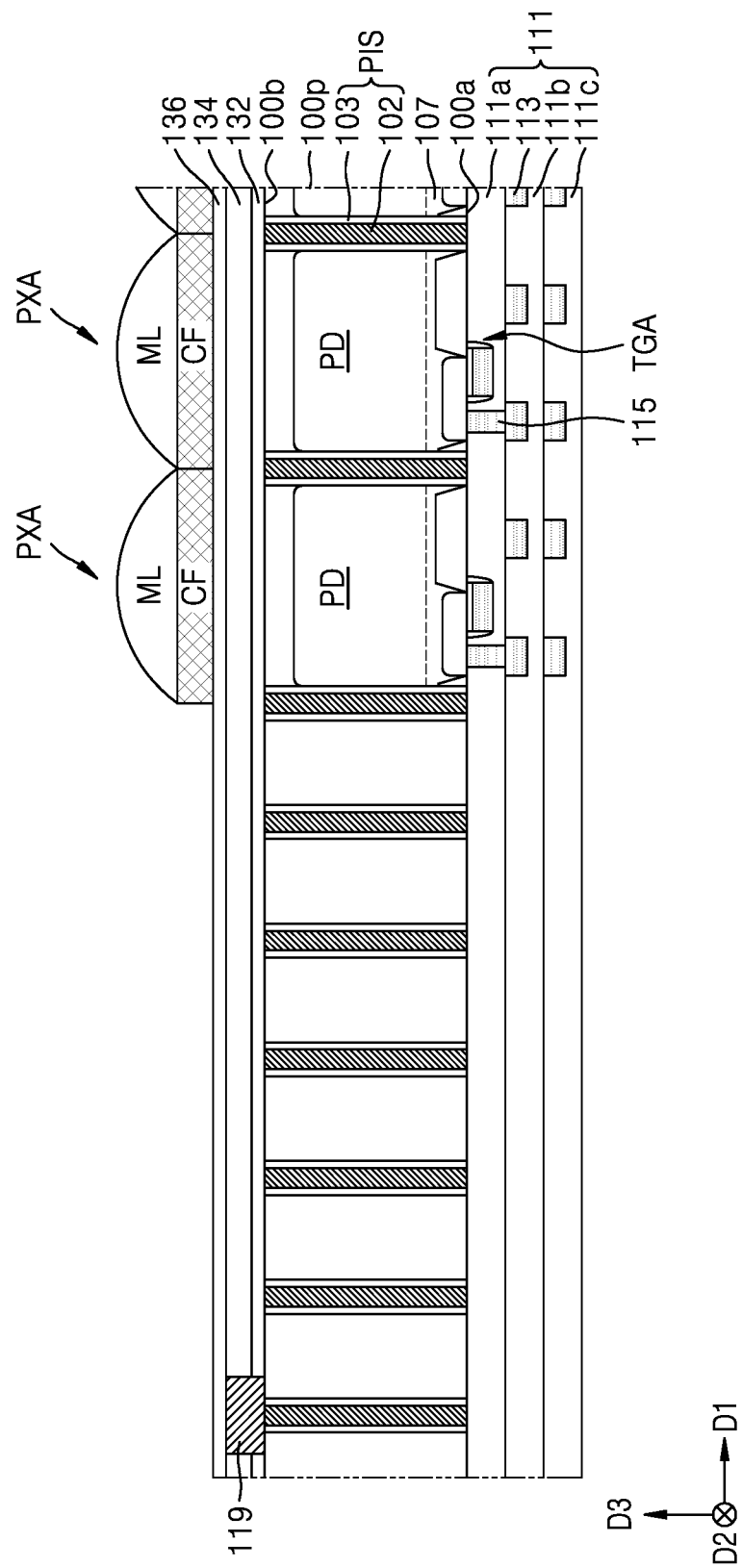
FIG. 3 is a vertical cross-sectional view of a structure of a pixel array, according to an embodiment of the inventive concept.

FIG. 3 is a vertical cross-sectional view of a structure of a pixel array, according to an embodiment of the inventive concept.

Referring to FIG. 3, the image sensor may include a substrate loop. The substrate 100p may include a first surface 100a and a second surface 100b that are opposite to each other. For example, the first surface 100a may be a front surface of the substrate 100p, and the second surface 100b may be a rear surface of the substrate 100p. Circuits may be arranged on the first surface 100a, and light may be incident to the second surface 100b.

The substrate 100p may be a silicon substrate doped with impurities of a first conductive type, for example, n-type impurities, but the inventive concept is not limited thereto. The substrate 100 may be any one of a germanium substrate, a silicon-germanium substrate, a II-VI group compound semiconductor substrate, a III-V group compound semiconductor substrate, and a silicon on insulator (SOI) substrate. According to an embodiment of the inventive concept, in the substrate 100p, a concentration of the first conductive-type impurities may decrease from the first surface 100a to the second surface 100b.

Unit pixels arranged in a matrix in first and second directions D1 and D2 may be formed on the substrate 100p, and the unit pixels may be distinguished from each other by a device isolation structure PIS.

The device isolation structure PIS may be arranged in the substrate 100p and may distinguish unit pixel areas PXA arranged in a matrix in the first direction D1 or the second direction D2. The device isolation structure PIS may surround each unit pixel area PXA in a plan view. For example, the device isolation structure PIS may include first portions extending in parallel with each other in the first direction D1 and second portions extending in parallel with each other in the second direction D2 across the first portions. In the plan view, the device isolation structure PIS may have a lattice shape.

The device isolation structure PIS may penetrate the substrate 100p. In other words, the device isolation structure PIS may vertically extend from the first surface 100a of the substrate 100p to the second surface 100b of the substrate 100p. In other words, a vertical thickness of the device isolation structure PIS may be substantially the same as that of the substrate 100p. The device isolation structure PIS may be a Deep Trench Isolation (DTI) layer formed in the substrate 100p. The device isolation structure PIS may be a Front-side Deep Trench Isolation (FDTI) layer formed by etching the device isolation structure PIS from the first surface 100a to the second surface 100b of the substrate 100p.

The device isolation structure PIS may include a first insulating layer 103 and a first conductor 102 on the first insulating layer 103. For example, the first insulating layer 103 may include a silicon oxide layer, a silicon nitride layer, air, or a combination thereof. The first conductor 102 may include, for example, at least one of undoped polysilicon, metal silicide, and a metal-containing layer. After a trench defining a shape of the device isolation structure PIS is formed, the first insulating layer 103 may be formed along a surface of the trench, and the first conductor 102 may fill the inside of the trench. For example, the first conductor 102 may be disposed between the first insulating layer 103 in the trench.

A conductive contact 119 may be electrically connected to an external wire layer and may apply a negative voltage to the device isolation structure PIS. The conductive contact 119 may be connected to the first conductor 102 of the device isolation structure PIS. For example, the conductive contact 119 may be in direct contact with the first conductor 102. When a negative voltage is applied to the device isolation structure PIS by the conductive contact 119, holes in the substrate 100p may move towards an interface of the device isolation structure PIS and accumulate at the interface. Accordingly, the occurrence of the dark current may decrease in the image sensor. A voltage application circuit may include the conductive contact 119 to apply a negative voltage to the device isolation structure PIS and may use a voltage source such as a pixel voltage. FIG. 3 illustrates that the conductive contact 119 is arranged on the second surface 100b of the substrate 100p. However, the conductive contact 119 may be arranged on the first surface 100a of the substrate 100p.

The photodiode PD may be arranged in each pixel area PXA of the substrate 100p. The photodiode PD may be separated from the first surface 100a of the substrate 100p. For example, a portion of the substrate 100p may be provided between the first surface 100a of the substrate 100p and the photodiode PD. The photodiode PD may be, for example, an area doped with n-type impurities. In the pixel areas PXA of the substrate 100p, a well area 107 may be arranged. The well area 107 may be adjacent to the first surface 100a of the substrate 100p. The well area 107 may be, for example, an area doped with p-type impurities. The well area 107 may be referred to as a bulk area.

On the first surface 100a of the substrate 100p, a wire structure 111 may be arranged. The wire structure 111 includes logic transistors, wires 113 connected thereto, and contact plugs 115. Interlayer insulating layers 111a, 111b, and 111c may be stacked on the first surface 100a of the substrate 100p and may cover a transfer gate TGA. In the interlayer insulating layers 111a, 111b, and 111c, the contact plugs 115 and the wires 113 may be arranged. Through the contact plugs 115, the logic transistors may be electrically connected to the floating diffusion node FD.

Color filters CF and micro-lenses ML may be arranged above the second surface 110b of the substrate 100p. Between the second surface 110b of the substrate 100p and the color filters CF, a reflection prevention layer 132 and first and second insulating layers 134 and 136 may be arranged. The reflection prevention layer 132 may prevent light reflection so that the light incident to the second surface 100b of the substrate 100p may smoothly reach the photodiode PD. The second insulating layer 136 may cover the conductive contact 119. The conductive contact 119 may be provided in an opening formed in the reflection prevention layer 132 and the first insulating layer 134.

The color filters CF and the micro-lenses 150 may respectively correspond to the pixel areas PX. The color filters CF include red, green, or blue color filters according to the unit pixels. The color filters CF may be two-dimensionally arranged and may include yellow, magenta, and cyan filters. In addition, the color filters CF may further include white filters.

The micro-lens 150 may be convex and have a certain radius of curvature. The micro-lens 150 may include light-transmissive resin and concentrate incident light to each pixel area.

It is illustrated that the device isolation structure PIS has a uniform width in one direction. However, the width of the device isolation structure PIS may gradually decrease from the first surface 100a of the substrate 100p to the second surface 100b of the substrate 100p.

Figure 4:
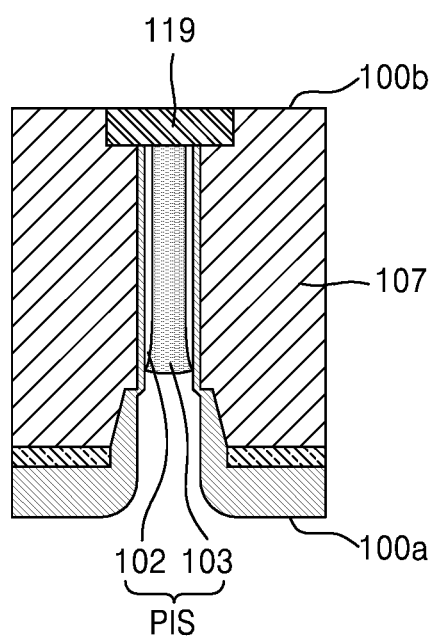
FIG. 4 is a vertical cross-sectional view of an operation of the image sensor, according to an embodiment of the inventive concept.

FIG. 4 is a vertical cross-sectional view of an operation of the image sensor, according to an embodiment of the inventive concept.

Referring to FIGS. 2 and 4, the device isolation structure PIS may be arranged between the photoelectric transformation elements to physically isolate the photoelectric transformation elements. The device isolation structure PIS may be formed from a front surface 100a of a semiconductor substrate to a rear surface 100b of the semiconductor substrate. The device isolation structure PIS may include a device isolation insulating pattern including a silicon nitride layer or a tantalum oxide layer and a device isolation conductive pattern including tungsten (W), aluminum (Al), or doped polysilicon. The device isolation structure PIS may be a DTI or a FDTI.

The image sensor may apply a certain voltage to the conductive contact 119 connected to the device isolation structure PIS and prevent the occurrence of a dark current in the pixel.

A first terminal of the well area 107 may receive a bulk control voltage (e.g., the bulk control voltage BCS of FIG. 2) from a row driver and may supply, to the well area 107, a voltage according to the bulk control voltage. The well area 107 may be a P-WELL area and formed around a gate of the driving transistor SF, a gate of the selection transistor SX, and a gate of the reset transistor RG. An area doped with n+ may be formed in the well area 107 and may function as a source terminal or a drain terminal of each of the driving transistor SF, the selection transistor SX, and the reset transistor RG. The well area 107 may electrically insulate the area doped with n+.

A voltage level of the well area 107 may vary depending on the voltage according to the bulk control voltage BCS provided through the first terminal of the well area 107. The varying voltage level of the well area 107 may affect the photodiode PD and the potential of the gate of the transmission transistor TG.

In the case of a pixel driven with low power, the bulk control voltage BCS having a negative level may be applied to the well area 107 to drive the pixel. In this case, however, an absolute value of the level of the negative voltage applied to the device isolation structure PIS is small, and thus, the efficiency of restricting the dark current may decrease. In other words, the dark current may still exist. To further reduce the dark current, the image sensor 100 may control the bulk control voltage BCS and adjust a difference between the level of the negative voltage applied to the device isolation structure PIS and the voltage applied to the well area 107.

According to a size of the bulk control voltage BCS applied to the well area 107, when the charges accumulated in the transmission transistor TG are moved to the floating diffusion node FD, all of the charges accumulated in the photodiode PD may not be moved, and thus, a ratio of remaining charges may increase. In addition, according to the size of the bulk control voltage BCS applied to the well area 107, a leakage current may be generated at a point in time when the selection transistor SX is turned off.

The image sensor 100 may adjust a timing of applying the bulk control voltage BCS to the well area 107 to improve the effect of the negative voltage applied to the conductive contact 119 of the device isolation structure PIS in a preset section of one frame period in which sensing signals are read from the pixels PX of the pixel array 110, and thus, prevent the generation of the leakage current in the transistors in other sections of the one frame period.

Figure 5A:
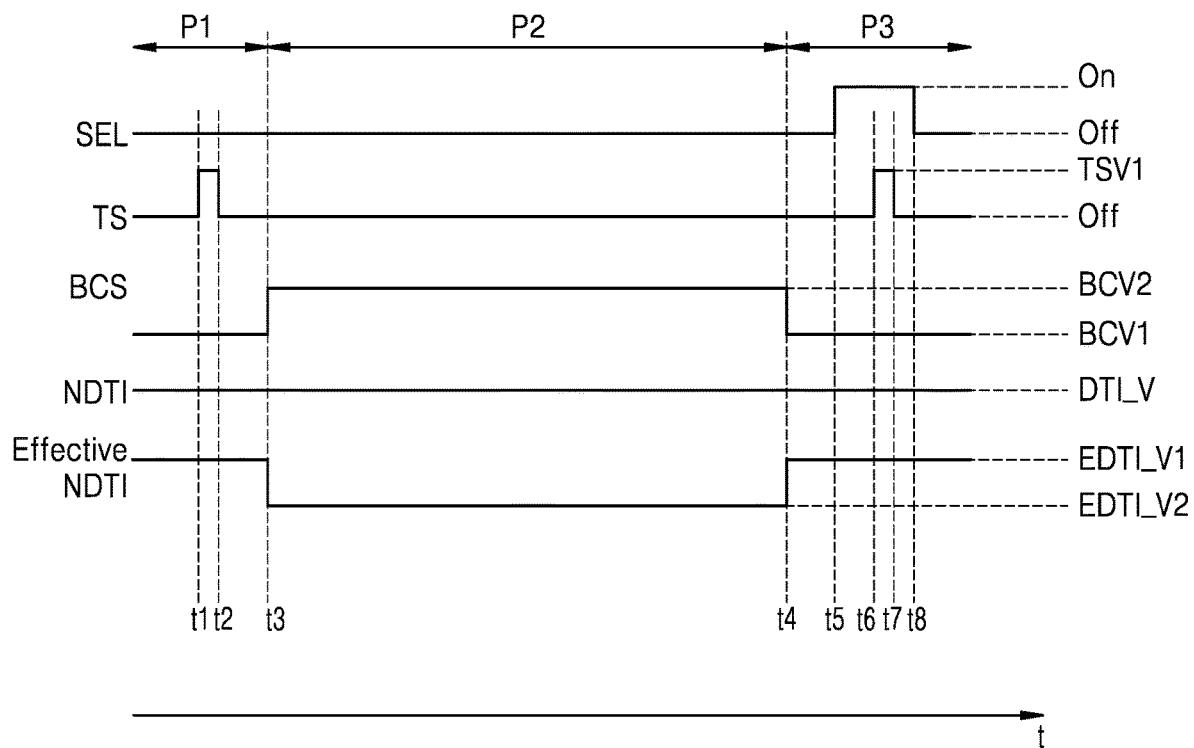
FIGS. 5A and 5B are timing diagrams of an operation of an image sensor, according to an embodiment of the inventive concept.
Figure 5B:
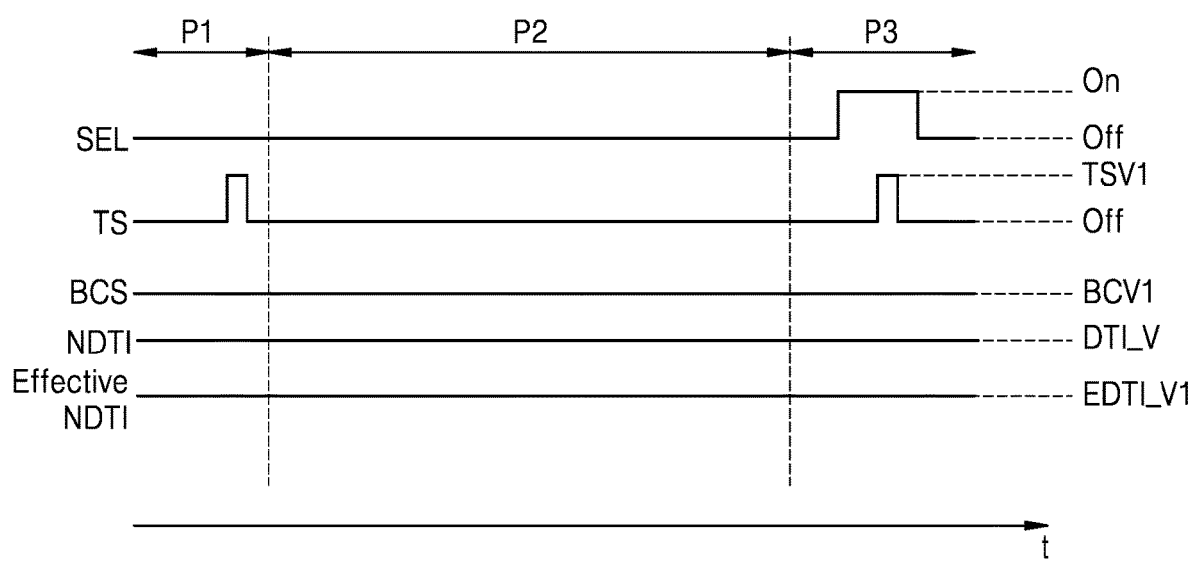

FIG. 5A is a timing diagram of an operation of an image sensor, according to an embodiment of the inventive concept, and FIG. 5B is a timing diagram of an operation of an image sensor, according to a comparative example. FIG. 5A illustrates periods in which photo-charges are generated in the photodiode PD of the pixel PX and sensing signals are output according to the photo-charges. In an embodiment of the inventive concept, FIG. 5A may illustrate one frame period in which sensing signals are read from respective pixels PX included in the pixel array 110.

Referring to FIGS. 2 and 5A, one frame period may include a first period P1, a second period P2, and a third period P3. In the first period P1, the photodiode PD may be initialized. The initialization of the photodiode PD may indicate that the photo-charges remaining in the photodiode PD are removed. To accomplish this, as illustrated in FIG. 5A, a transmission control signal TS having a turn-on level (e.g., TSV1) may be transmitted to the transmission transistor TG of the pixels PX included in the pixel array 110. As the transmission transistors TG are turned on and the photo-charges remaining in the photodiode PD are transmitted to the floating diffusion node FD, the photodiode PD may be reset.

In the second period P2, a photodiode PD of one of the pixels PX may receive an optical signal, and the photo-charges may be generated. In other words, the second period P2 may be an exposure period.

In the third period P3, a vertical synchronization signal may be transmitted to read out a signal of a pixel PX, and the selection control signal SEL may be transmitted to the selection transistor SX.

A voltage NDTI applied to the device isolation structure (e.g., the device isolation structure PIS of FIG. 3) may have a negative voltage level DTI_V. As described above, when a negative voltage is applied to the device isolation structure, the generation of the dark current may be restricted. For example, a very small amount or no dark current may be generated. In the FDTI structure, the generation of the dark current may be restricted by applying the negative voltage to the device isolation structure.

The bulk control voltage BCS may be changed to a first bulk control voltage BCV1 (e.g., −0.6 V) in the first period P1, a second bulk control voltage BVC2 (e.g., 0 V) in the second period P2, and the first bulk control voltage BCV1 again in the third period P3. In this case, an effective voltage (an effective NDTI) applied to the device isolation structure may have a value obtained by subtracting the bulk control voltage BCS from the voltage NDTI applied to the device isolation structure. Thus, the effective NDTI may be EDTI_V1 in the first period P1, EDTI_V2 in the second period P2, and EDTI_V1 in the third period P3. In other words, in the second period P2, EDTI_V2 that is a lower negative voltage may be applied to the device isolation structure.

The second period P2 may be a period in which charges may be accumulated in the photodiode through exposure. A period of accumulating charges may increase in a low-illumination environment, and the period may include a vertical blank period (Vblank time) in which no vertical synchronization signal is input. In the second period P2, the effect of the voltage NDTI applied to the device isolation structure may increase and the dark current may be further restricted by applying the second bulk control voltage BCV2 that is 0 V.

FIG. 5B is a timing diagram for explaining an operation of an image sensor for comparison with the inventive concept. In FIG. 5B, the image sensor uniformly applies the bulk control voltage BCS to restrict a dark current when a low-power pixel voltage is applied. In other words, the bulk control voltage BCS does not transition from one value to another. Because the voltage NDTI applied to the device isolation structure and the bulk control voltage BCS are uniformly applied, the effective voltage (the effective NDTI) applied to the device isolation structure may also be uniform. In this case, the image sensor, employing the technique of FIG. 5B, may gain restrict the dark current by applying the bulk control voltage BCS. However, when the accumulated charges are moved in response to a signal transmitted to the transmission transistor TG, a ratio of remaining charges may increase, and a leakage current may be generated when the selection transistor SX is turned off.

Figure 6A:
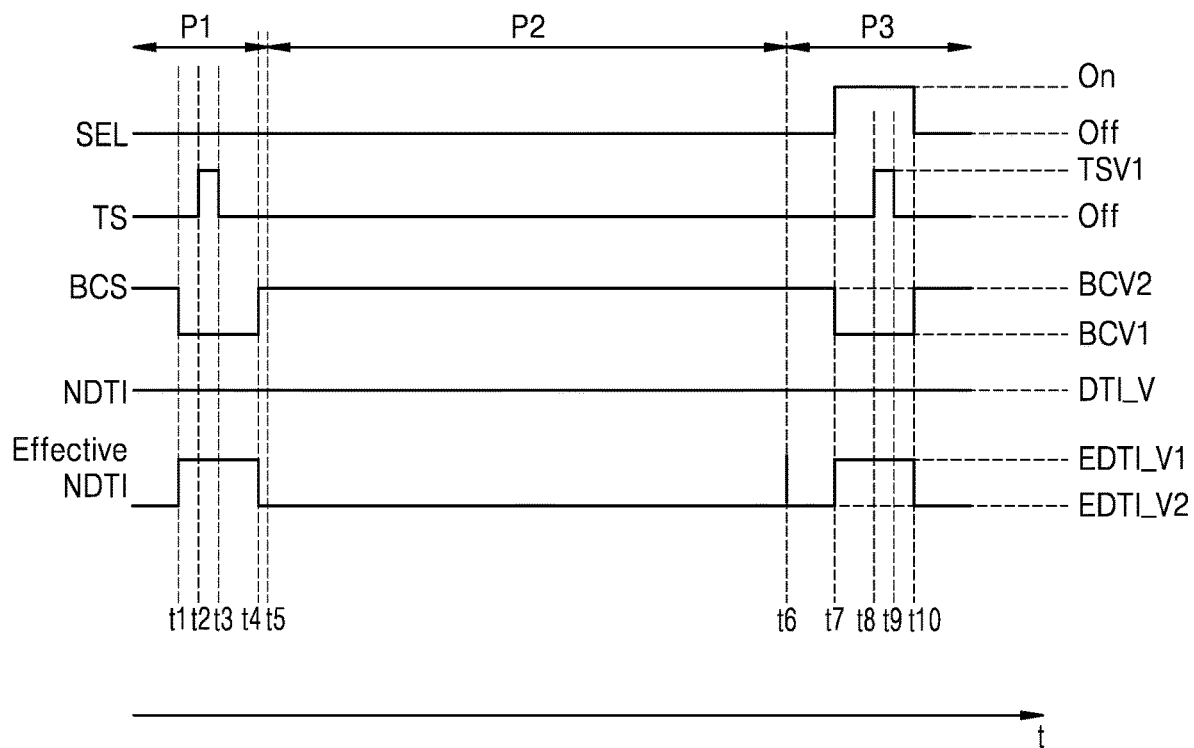
FIGS. 6A and 6B are timing diagrams of an operation of an image sensor, according to an embodiment of the inventive concept.
Figure 6B:
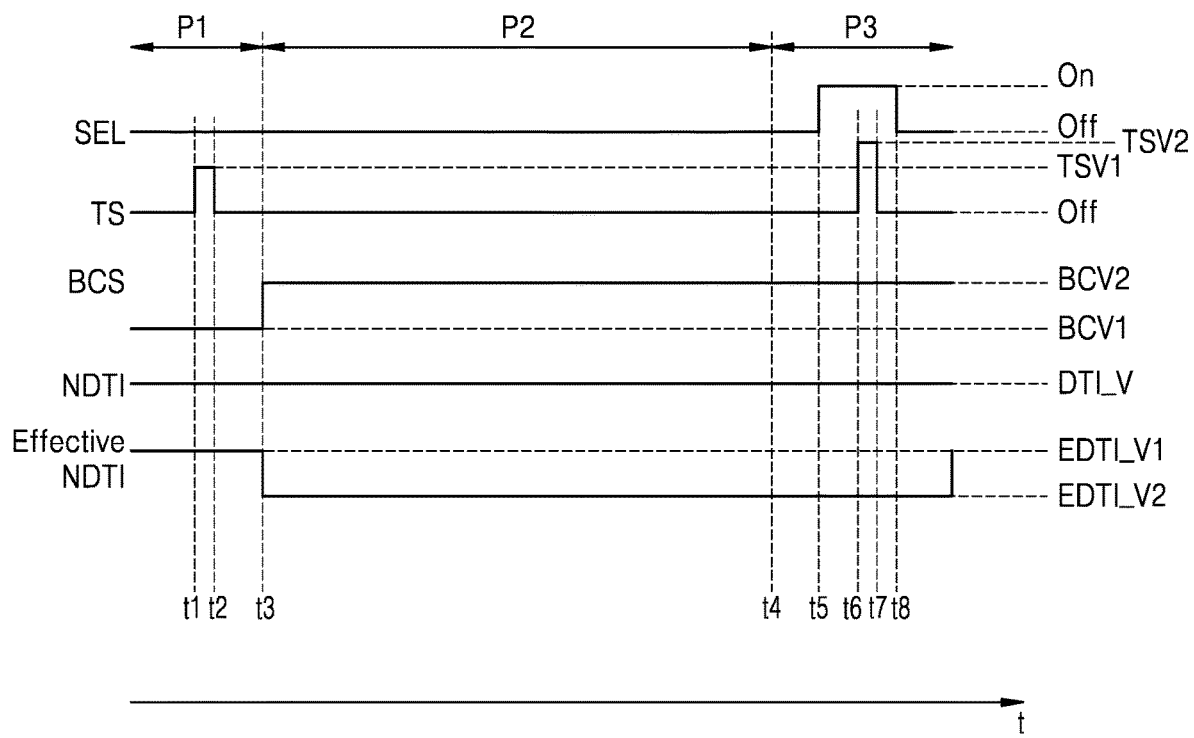

FIGS. 6A and 6B are timing diagrams of an operation of an image sensor, according to an embodiment of the inventive concept.

Referring to FIGS. 2 and 6A, the image sensor may apply the first bulk control voltage BCV1 as the bulk control voltage BCS only in points in time t7 to t10, when the selection control signal SEL is turned on, during the third period P3. This is different from FIG. 5A in which the first bulk control signal BCS is applied from time point t4 to time point t8. In addition, in FIG. 6A, the image sensor may apply the second bulk control voltage BCV2 in other points in time of the third period P3 when the selection control signal SEL is turned off. For example, the second bulk control voltage BCV2 may be applied from time point t6 to time point t7, and after time point t10. When the first bulk control voltage BCV1 (e.g., −0.6 V) is applied as the bulk control voltage BCS in the third period P3, a turn-off signal may be applied to the gate of the selection transistor SX at the first bulk control voltage BCV1 (e.g., −0.6 V) instead of 0 V, and thus, a leakage current may be generated. Therefore, the image sensor may apply the first bulk control voltage BCV1 only when the selection transistor SX is turned on and may apply the second bulk control voltage BCV2 when the selection transistor SX is turned off, thereby reducing a current that leaks when the selection control signal SEL is turned off.

Referring to FIG. 6B, the image sensor may apply the second bulk control voltage BCV2 as the bulk control voltage BCS in the third period P3 in which the selection control signal SEL is transmitted to the selection transistor SX to read the signal of the pixel PX. In this case, the leakage current may not be generated in the selection transistor SX, but the transmission efficiency may decrease when the transmission transistor TG operates in the third period P3. Therefore, a voltage applied to the gate of the transmission transistor TG is as high as a difference between the second bulk control voltage BCV2 and the first bulk control voltage BCV1 (e.g., the voltage applied to the gate of the transmission transistor increases from TSV1 to TSV2), and thus, the same effect as the effect obtained in the third period P3 of FIG. 5A may be obtained.

Figure 7A:
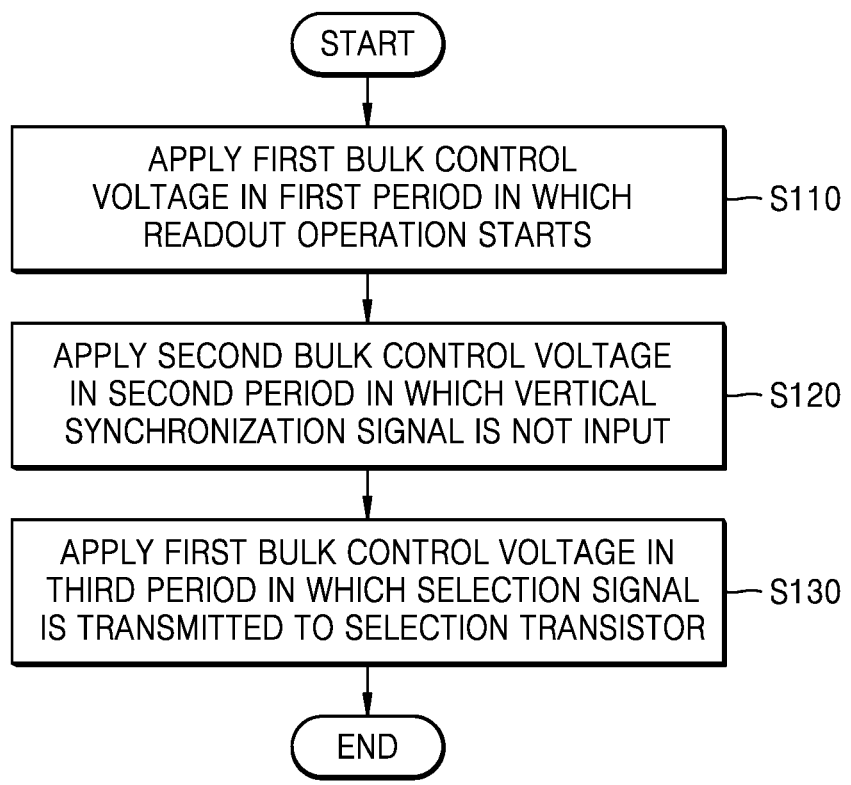
FIGS. 7A and 7B are flowcharts of an operation of an image sensor, according to an embodiment of the inventive concept.
Figure 7B:
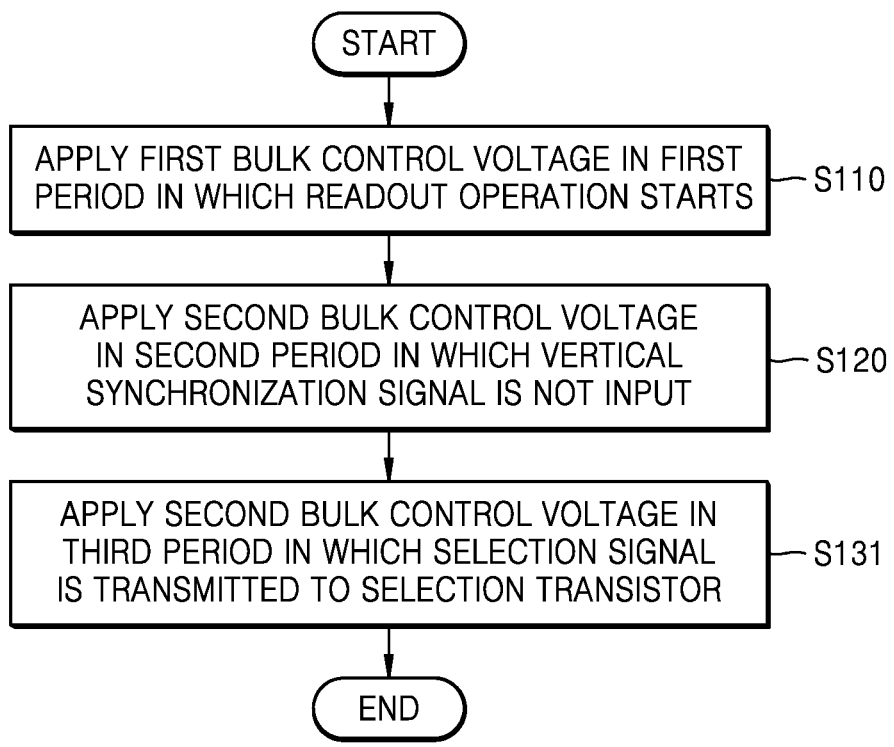

FIGS. 7A and 7B are flowcharts of an operation of an image sensor, according to an embodiment of the inventive concept.

Referring to FIG. 7A, in operation S110, the image sensor may apply a first bulk control voltage, which has a negative voltage level, to a bulk area of a pixel, to control a level of a negative voltage applied to a device isolation structure and a level of a voltage applied to the bulk area, in a first period in which a photodiode of the pixel is initialized. The image sensor may apply the first bulk control voltage having the negative voltage level to the bulk area to drive the pixel with low power. In other words, the first bulk control voltage may be applied in a first period in which a readout operation starts.

In operation S120, the image sensor may apply a second bulk control voltage to the bulk area in a second period in which photo-charges are accumulated in the photodiode. In other words, the second bulk control voltage may be applied in a second period in which a vertical synchronization signal is not input. The second bulk control voltage may be higher than the first bulk control voltage and may be, for example, 0 V. As a voltage applied to the bulk area increases, a difference between a voltage applied to the device isolation structure and a voltage applied to the bulk area may increase, and the effect of preventing the generation of the dark current may be improved.

In operation S130, the image sensor may apply the first bulk control voltage to the bulk area in the third period in which the selection control signal is transmitted to the selection transistor to read the signal of the pixel. In addition, the image sensor may apply the first bulk control voltage to a first terminal of the photodiode only when the selection transistor is turned on during the third period.

Referring to FIG. 7B, in operation S131, the second bulk control voltage may be applied to the first terminal of the photodiode instead of the first bulk control voltage, in the third period.

The image sensor may vary a voltage level of a transmission control signal transmitted to the transmission transistor, according to a size of the bulk control voltage applied to the first terminal of the photodiode. For example, when the transmission control signal transmitted to the transmission transistor has a first voltage level because the first bulk control voltage that is the negative voltage is applied, and the transmission control signal transmitted to the transmission transistor has a second voltage level because the second bulk control voltage that is 0 V is applied, a difference between the first voltage level and the first bulk control voltage may be identical to a difference between the second voltage level and the second bulk control voltage.

Figure 8A:
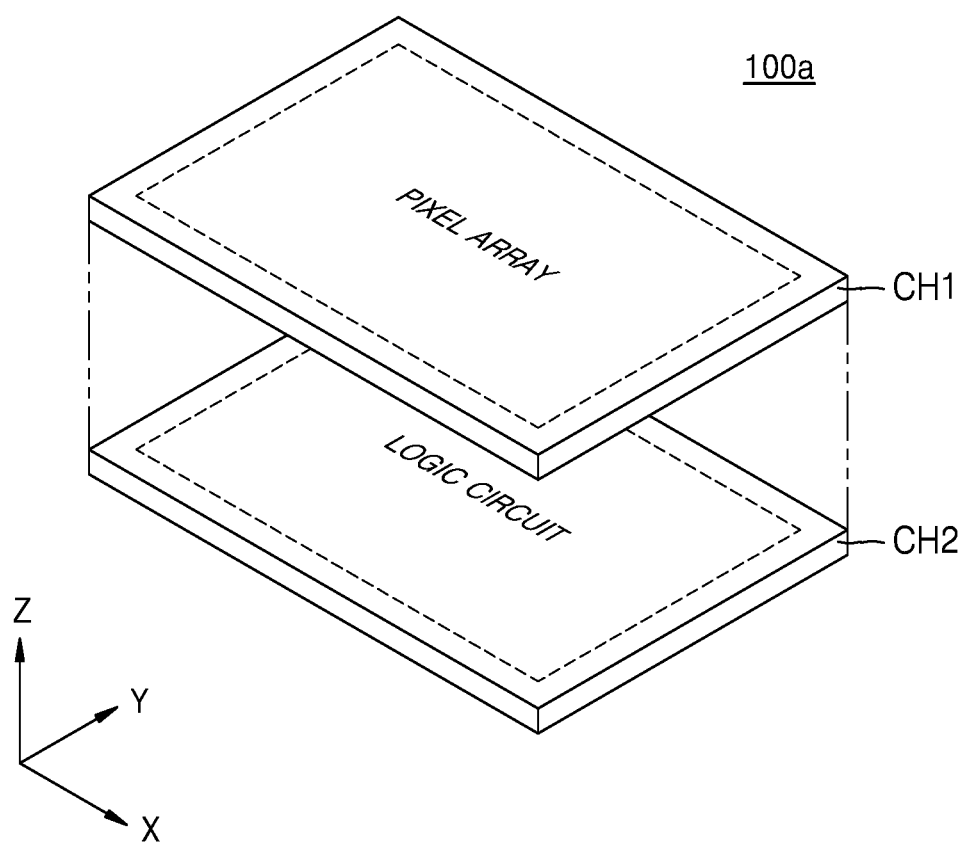
FIG. 8A is an exploded perspective view of an image sensor.
Figure 8B:
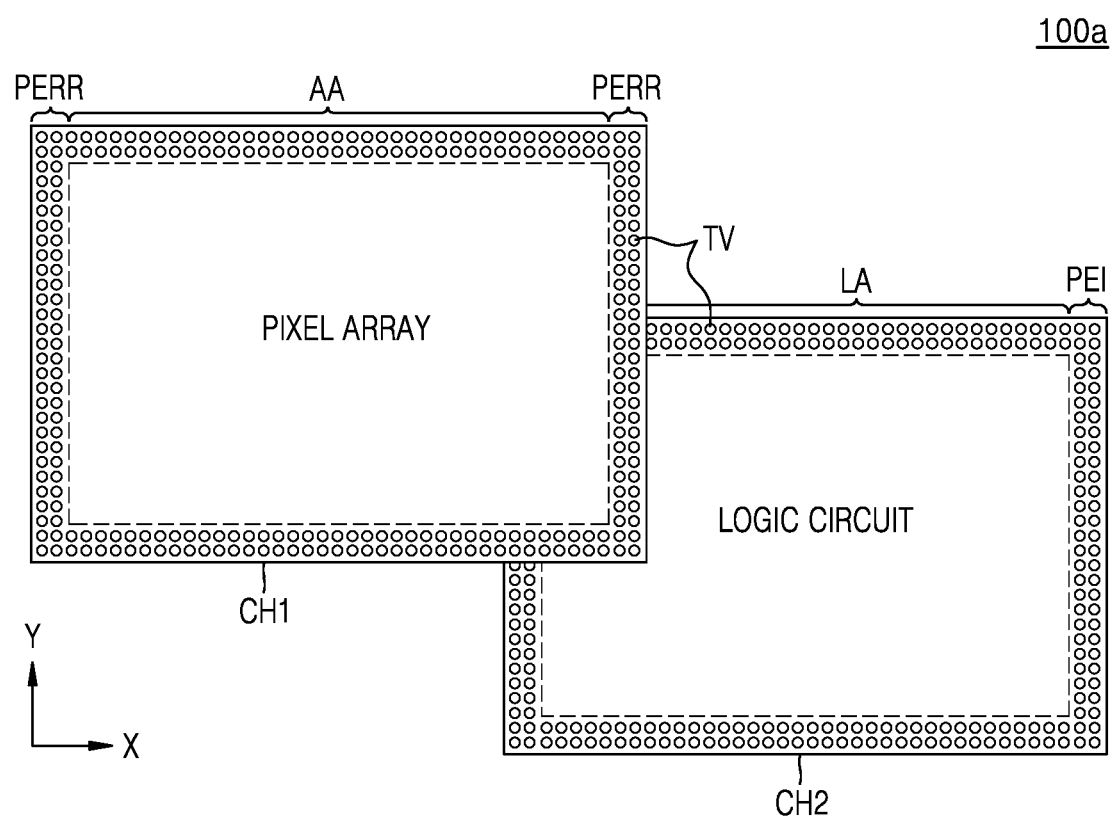
FIG. 8B is a plan view of an image sensor.

FIG. 8A is an exploded perspective view of an image sensor, and FIG. 8B is a plan view of the image sensor.

Referring to FIGS. 8A and 8B, an image sensor 100a may have a structure in which a first chip CH1 and a second chip CH2 are stacked. The pixel array (110 of FIG. 1) may be formed in the first chip CH1, and in the second chip CH2, a logic circuit, e.g., the row driver 120, the readout circuit 130, the ramp signal generator 140, and the timing controller 150, may be formed.

As illustrated in FIG. 8B, the first chip CH1 and the second chip CH2 may respectively include active areas AA and logic areas LA arranged at the centers of the first chip CH1 and the second chip CH2. In addition, the first chip CH1 and the second chip CH2 may include peripheral areas PERR and PEI on outer portions of the first chip CH1 and the second chip CH2. In the active area AA of the first chip CH1, the pixels PX may be arranged in a two-dimensional array structure. In the logic area LA of the second chip CH2, the logic circuit may be arranged.

In the peripheral areas PERR and PEL of the first chip CH1 and the second chip CH2, through vias may be arranged extending in a third direction (a Z direction). The first chip CH1 and the second chip CH2 may be electrically coupled to each other through the through vias. In the peripheral area PERR of the first chip CH1, wires and vertical contacts extending in the first direction (the X direction) or the second direction (the Y direction) may be further formed. On a wire layer of the second chip CH2, wire lines extending in the first direction (the X direction) and the second direction (the Y direction) may be arranged, and such wire lines may be connected to the logic circuit.

Although it is described that the first chip CH1 and the second chip CH2 are electrically coupled to each other through the through vias, the inventive concept is not limited thereto. For example, the first chip CH1 and the second chip CH2 may be coupled to each other in various coupling techniques such as Cu—Cu bonding, coupling between through vias and a Cu pad, coupling between through vias and external connection terminals, and coupling using an integral through via.

Figure 9:
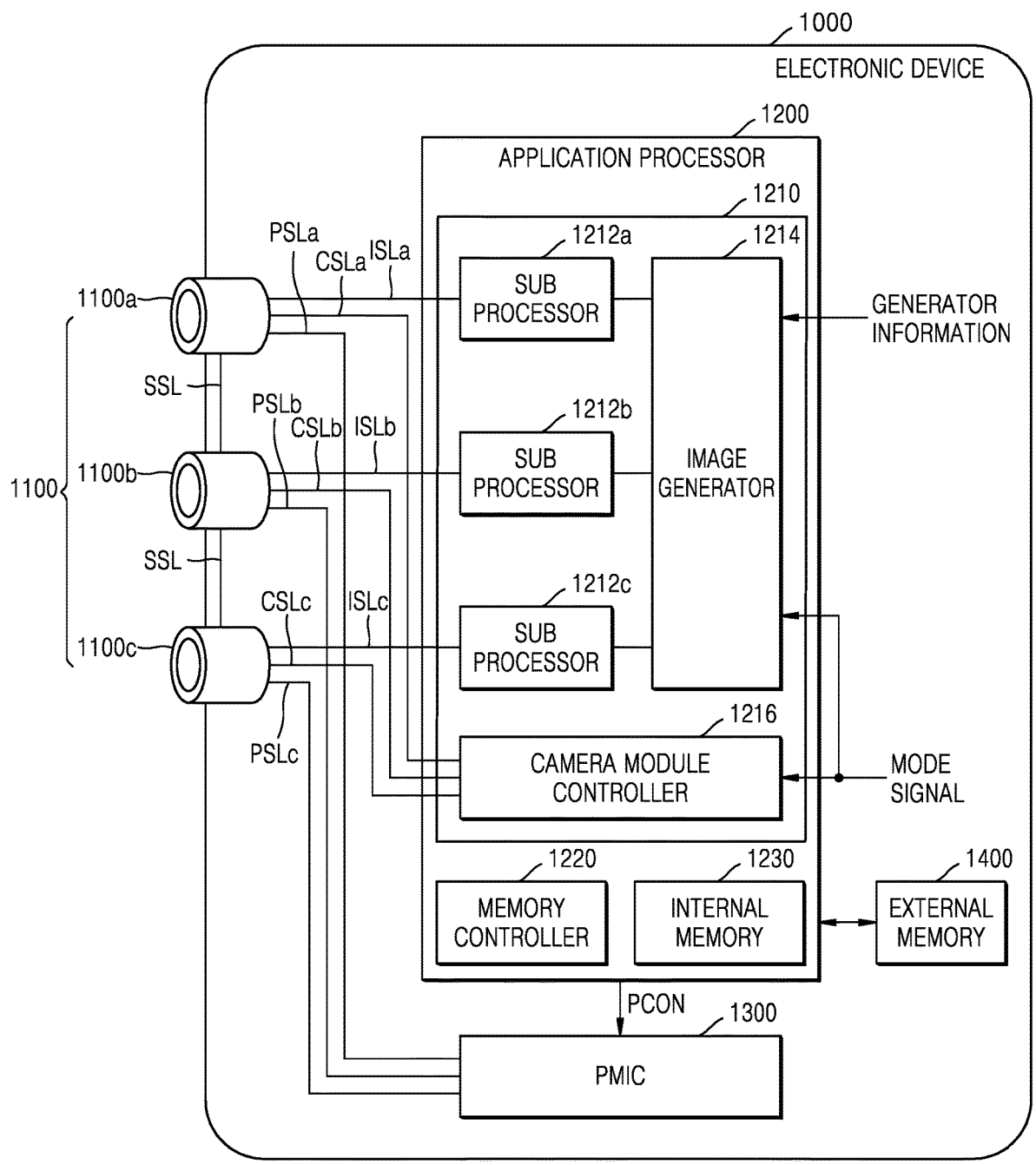
FIG. 9 is a block diagram of an electronic device including a multi-camera module.
Figure 10:
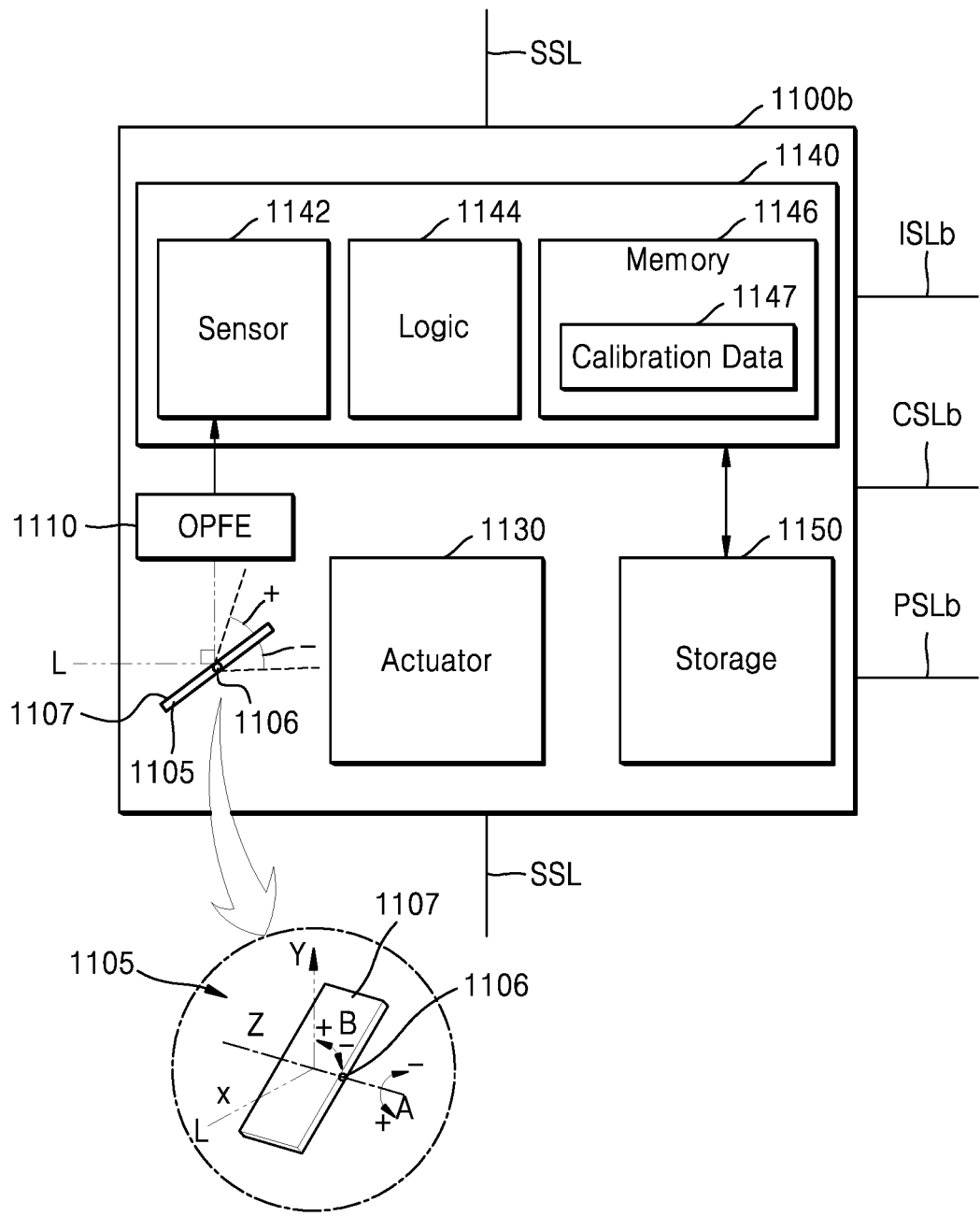
FIG. 10 is a detailed block diagram of the camera module of FIG. 9.

FIG. 9 is a block diagram of an electronic device including a multi-camera module. FIG. 10 is a detailed block diagram of the camera module of FIG. 9.

Referring to FIG. 9, an electronic device 1000 may include a camera module group 1100, an application processor 1200, a power management integrated circuit (PMIC) 1300, and an external memory 1400.

The camera module group 1100 may include camera modules 1100a, 1100b, and 1100c. Although FIG. 9 illustrates that three camera modules 1100a, 1100b, and 1100c are arranged, the inventive concept is not limited thereto. In some embodiments of the inventive concept, the camera module group 1100 may include only two camera modules. In addition, in some embodiments of the inventive concept, the camera module group 1100 may include k camera modules (where, k is a natural number equal to or greater than 4).

Hereinafter, a detailed structure of the camera module 1100b will be described in more detail with reference to FIG. 10, but the description may be identically applied to the other camera modules 1100a and 1100c according to an embodiment of the inventive concept.

Referring to FIG. 10, the camera module 1100b may include a prism 1105, an Optical Path Folding Element (OPFE) 1110, an actuator 1130, an image sensing device 1140, and a storage 1150.

The prism 1105 may include a reflection surface 1107 including a light reflection material and may change a path of light L incident from the outside.

In some embodiments of the inventive concept, the prism 1105 may change the path of the light L, which is incident in a first direction X, to be in a second direction Y perpendicular to the first direction X. In addition, the prism 1105 may rotate the reflection surface 1107 including the light reflection material in an A direction on a central axis 1106 or may rotate the central axis 1106 in a B direction, thereby changing the path of the light L, which is incident in the first direction X, to be in the second direction Y perpendicular to the first direction X. In this case, the OPFE 1110 may also be moved in a third direction Z perpendicular to the first direction X and the second direction Y.

In some embodiments, as shown in FIG. 10, a maximum degree of rotation of the prism 1105 in the A direction may be less than or equal to 15 degrees in a +A direction and may be greater than 15 degrees in a −A direction. However, the inventive concept is not limited thereto.

In some embodiments of the inventive concept, the prism 1105 may be moved in a range of about 20 degrees, between about 10 degrees and about 20 degrees, or between about 15 degrees and about 20 degrees in a + or −B direction. Here, the angle that is moved may be identical in the + or −B direction or may be similar in a range of about 1 degree.

In some embodiments of the inventive concept, the prism 1105 may move the reflection surface 1107 including the light reflection material in the third direction (e.g., the Z direction) parallel to an extension direction of the central axis 1106.

The OPFE 1110 may include, for example, an optical lens including m groups (where, m is a natural number). The m lenses may be moved in the second direction Y and may change an optical zoom ratio of the camera module 1100b. For example, when an optical zoom ratio of the camera module 1100b is Z, and when m optical lenses included in the OPFE 1110 are moved, an optical zoom ratio of the camera module 1100b may be changed to 3Z, 5Z, or more.

The actuator 1130 may move the OPFE 1110 or the optical lens (hereinafter, referred to as the optical lens) to a certain location. For example, the actuator 1130 may adjust a location of the optical lens to allow an image sensor 1142 to be in a focal length of the optical lens for accurate sensing.

The image sensing device 1140 may include the image sensor 1142, a control logic 1144, and a memory 1146. The image sensor 1142 may sense an image, which is a sensing target, by using the light L provided through the optical lens. The image sensor 1142 may generate image data having a high dynamic range by merging HCG image data with LCG image data.

The control logic 1144 may control all operations of the camera module 1100b. For example, the control logic 1144 may control the operation of the camera module 1100b in response to a control signal provided through a control signal line CSLb.

The memory 1146 may store information, for example, calibration data 1147, which is required to operate the camera module 1100b. The calibration data 1147 may include information that the camera module 1100b uses to generate image data by using the light L provided from the outside. The calibration data 1147 may include, for example, information regarding the above-described degree of rotation, information regarding the focal length, information regarding the optical axis, and the like. When the camera module 1100b is a multi-state camera of which a focal length changes according to a location of the optical lens, the calibration data 1147 may include a focal length value at each location (or each state) of the optical lens and information regarding auto-focusing.

The storage 1150 may store the image data that is sensed by the image sensor 1142. The storage 1150 may be disposed outside the image sensing device 1140 and may be stacked with a sensor chip forming the image sensing device 1140.

In some embodiments of the inventive concept, the storage 1150 may be an Electrically Erasable Programmable Read-Only Memory (EEPROM), but the inventive concept is not limited thereto.

Referring to FIGS. 9 and 10, in some embodiments of the inventive concept, the camera modules 1100a, 1100b, and 1100c may each include the actuator 1130. Accordingly, each of the camera modules 1100a, 1100b, and 1100c may include identical or different pieces of the calibration data 1147 according to operation of the actuator 1130 included in each of the camera modules 100a, 1100b, and 1100c.

In some embodiments of the inventive concept, one camera module (e.g., the camera module 1100b) from among the camera modules 1100a, 1100b, and 1100c may be a folded-lens camera module including the prism 1105 and the OPFE 1110 described above, and the other camera modules (e.g., the camera modules 1100a and 1100c may be vertical camera modules that do not include the prism 1105 and the OPFE 1110. However, the inventive concept is not limited thereto.

In some embodiments of the inventive concept, one camera module (e.g., the camera module 1100c) from among the camera modules 1100a, 1100b, and 1100c may be, for example, a vertical depth camera for extracting depth information by using Infrared rays (IR). In this case, the application processor 1200 may merge image data received from the depth camera with image data provided from another camera module (e.g., the camera module 1100a or 1100b) such that a 3D depth image may be generated.

In some embodiments of the inventive concept, at least two of the camera modules 1100a, 1100b, and 1100c (e.g., the camera modules 1100a and 1100b) may have different fields of view (viewing angles). In this case, for example, at least two of the camera modules 1100a, 1100b, and 1100c (e.g., the camera modules 1100a and 1100b) may have different optical lenses, but the inventive concept is not limited thereto.

In addition, in some embodiments of the inventive concept, the camera modules 1100a, 1100b, and 1100c may have different viewing angles. In this case, the camera modules 1100a, 1100b, and 1100c may have different optical lenses, but the inventive concept is not limited thereto.

In some embodiments of the inventive concept, the camera modules 1100a, 1100b, and 1100c may be physically separated from each other. In other words, the camera modules 1100a, 1100b, and 1100c do not divide and use a sensing area of one image sensor 1142, but may respectively include independent image sensors 1142.

Referring back to FIG. 9, the application processor 1200 may include an image processor 1210, a memory controller 1220, and an internal memory 1230. The application processor 1200 may be separated from the camera modules 1100a, 1100b, and 1100c. For example, the application processor 1200 and the camera modules 1100a, 1100b, and 1100c may be separate semiconductor chips.

The image processor 1210 may include sub-image processors 1212a, 1212b, and 1212c, an image generator 1214, and a camera module controller 1216.

The image processor 1210 may include the sub-image processors 1212a, 1212b, and 1212c, the number of which corresponds to the number of camera modules 1100a, 1100b, and 1100c. In other words, a sub-image processor may be provided for each camera module.

Image data respectively generated by the camera modules 1100a, 1100b, and 1100c may be provided to the corresponding sub-image processors 1212a, 1212b, and 1212c through image signal lines ISLa, ISLb, and ISLc that are separated from each other. For example, the image data generated by the camera module 1100a may be provided to the sub-image processor 1212a through the image single line ISLa, the image data generated by the camera module 1100b may be provided to the sub-image processor 1212b through the image single line ISLb, and the image data generated by the camera module 1100c may be provided to the sub-image processor 1212c through the image single line ISLc. Such image data transmission may be performed by using, for example, a Camera Serial Interface (CSI) based on a Mobile Industry Processor Interface (MIPI), but the inventive concept is not limited thereto.

In some embodiments of the inventive concept, one sub-image processor may be arranged corresponding to camera modules. For example, the sub-image processor 1212a and the sub-image processor 1212c may not be separated from each other as shown in FIG. 9, but may be integrally formed into one sub-image processor. The image data provided from the camera modules 1100a and 1100c may be selected by a selection device (e.g., a multiplexer), etc. and then provided to the integrated sub-image processor.

The image data provided to each of the sub-image processors 1212a, 1212b, and 1212c may be provided to the image generator 1214. The image generator 1214 may generate an output image by using the image data provided from each of the sub-image processors 1212a, 1212b, and 1212c, according to image generating information or a mode signal.

For example, the image generator 1214 may merge at least some pieces of the image data generated by the camera modules 1100a, 1100b, and 1100c having different viewing angles according to the image generating information or the mode signal and then may generate an output image. In addition, the image generator 1214 may select any one of the pieces of image data generated by the camera modules 1100a, 1100b, and 1100c having different viewing angles according to the image generating information or the mode signal and may generate the output image.

In some embodiments of the inventive concept, the image generating information may include a zoom signal or a zoom factor. In addition, in some embodiments of the inventive concept, the mode signal may be, for example, a signal based on a mode selected by a user.

When the image generating information is a zoom signal (e.g., a zoom factor) and the camera modules 1100a, 1100b, and 1100c have different fields of view (e.g., viewing angles), the image generator 1214 may perform different operations according to types of zoom signals. For example, when the zoom signal is a first signal, after the image data output from the camera module 1100a is merged with the image data output from the camera module 1100c, an output image may be generated by using the merged image data and the image data that are output from the camera module 1100b and not used during the above merging. When the zoom signal is a second signal different from the first signal, the image generator 1214 may select any one of the pieces of image data output from the camera modules 1100a, 1100b, and 1100c instead of performing the image data merging and may generate the output image. However, the inventive concept is not limited thereto, and a method of processing image data may vary.

In some embodiments of the inventive concept, the image generator 1214 may receive multiple pieces of image data having different exposure times from at least one of the sub-image processors 1212a, 1212b, and 1212c and may perform High Dynamic Range (HDR) processing on the pieces of image data, thereby generating the merged image data having an increased dynamic range.

The camera module controller 1216 may provide control signals to the camera modules 1100a, 1100b, and 1100c, respectively. The control signals generated from the camera module controller 1216 may be provided to corresponding camera modules 1100a, 1100b, and 1100c through the control signal lines CSLa, CSLb, and CSLc that are separated from each other.

Any one of the camera modules 1100a, 1100b, and 1100c (e.g., the camera module 1100b) may be designated as a master camera according to the image generating information including a zoom signal or the mode signal, and the other camera modules 1100a, 1100b, and 1100c (e.g., the camera modules 1100a and 1100c) may be designated as slave cameras. Such information may be included in the control signal and may be provided to the corresponding camera modules 1100a, 1100b, and 1100c through the control signal lines CSLa, CSLb, and CSLc that are separated from each other.

According to a zoom factor or an operation mode signal, a camera module functioning as a master and slave may change. For example, when the viewing angle of the camera module 1100a is greater than that of the camera module 1100b and the zoom factor indicates a low zoom ratio, the camera module 1100b may function as a master, and the camera module 1100a may function as a slave. In the alternative, when the zoom factor indicates a high zoom ratio, the camera module 1100a may function as a master, and the camera module 1100b may function as a slave.

In some embodiments of the inventive concept, the control signal provided to each of the camera modules 1100a, 1100b, and 1100c from the camera module controller 1216 may include a sync enable signal. For example, when the camera module 1100b is a master camera and the camera modules 1100a and 1100c are slave cameras, the camera module controller 1216 may transmit the sync enable signal to the camera module 1100b. The camera module 1100b receiving the sync enable signal may generate a sync signal in response to the received sync enable signal and may provide the generated sync signal to the camera modules 1100a and 1100c through a sync signal line SSL as shown in FIG. 10. The camera module 1100b and the camera modules 1100a and 1100c may transmit the image data to the application processor 1200 in synchronization with the sync signal.

In some embodiments of the inventive concept, the control signals provided to the camera modules 1100a, 1100b, and 1100c from the camera module controller 1216 may include mode information according to a mode signal. Based on the mode information, the camera modules 1100a, 1100b, and 1100c may operate in a first operation mode and a second operation mode with regard to sensing speed.

In the first operation mode, the camera modules 1100a, 1100b, and 1100c may generate an image signal at a first speed (e.g., generate an image signal of a first frame rate), encode the image signal at a second speed that is greater than the first speed (e.g., encode the image signal of a second frame rate that is greater than the first frame rate), and transmit the encoded image signal to the application processor 1200. In this case, the second speed may be less than or equal to 30 times the first speed.

The application processor 1200 may store the received image signal, in other words, the encoded image signal, in the memory 1230 inside the application processor 1200 or in the external memory 1400 outside the application processor 1200. Then, the application processor 1200 may read the encoded image signal from the memory 1230 or the external memory 1400 and decode the same, and may display image data generated according to the decoded image signal. For example, a corresponding one of the sub-processors 1212a, 1212b, and 1212c of the image processor 1210 may perform decoding and also image processing on the decoded image signal.

In the second operation mode, the camera modules 1100a, 1100b, and 1100c may generate image signals at a third speed that is less than the first speed (e.g., generate image signals of a third frame rate that is less than the first frame rate) and may transmit the image signals to the application processor 1200. The image signals provided to the application processor 1200 may be signals that are not encoded. The application processor 1200 may perform image processing on received image signals or may store image signals in the memory 1230 or the external memory 1400.

The PMIC 1300 may supply power, for example, a power voltage, to each of the camera modules 1100a, 1100b, and 1100c. For example, under the control of the application processor 1200, the PMIC 1300 may supply first power to the camera module 1100a through a power signal line PSLa, supply second power to the camera module 1100b through a power signal line PSLb, and supply third power to the camera module 1100c through a power signal line PSLc.

In response to a power control signal PCON from the application processor 1200, the PMIC 1300 may generate power corresponding to each of the camera modules 1100a, 1100b, and 1100c and may also adjust a power level. The power control signal PCON may include a power adjustment signal for an operation mode of each of the camera modules 1100a, 1100b, and 1100c. For example, the operation mode may include a low power mode, and in this case, the power control signal PCON may include information regarding a camera module operating in the low power mode and information regarding a set power level. The power levels of the camera modules 1100a, 110b, and 1100c may be identical to or different from each other. In addition, the power level may dynamically change.

While the inventive concept has been particularly shown and described with reference to embodiments thereof, it will be understood that various changes in form and details may be made thereto without departing from the spirit and scope of the inventive concept as set forth in the following claims.

What is claimed is:
1. An image sensor, comprising:
a pixel array comprising a plurality of pixels and a row driver configured to drive the pixel array, wherein each of the plurality of pixels comprises at least one photodiode, a transmission transistor, a selection transistor, a device isolation structure, and a bulk area, and
the row driver is configured to adjust, for each of preset periods, sizes and application timings of a negative voltage applied to the device isolation structure and a bulk control voltage applied to the bulk area while a first pixel is driven,
wherein the row driver is configured to apply a first bulk control voltage having a negative level to the bulk area of the first pixel in a first period in which the at least one photodiode of the first pixel is initialized while a first transmission control signal is transmitted to the transmission transistor of the first pixel,
wherein the row driver is configured to apply a second bulk control voltage, which is higher than the first bulk control voltage, to the bulk area of the first pixel in a second period in which a plurality of photo-charges are accumulated in the at least one photodiode of the first pixel, and wherein the second bulk control voltage is applied for the entire time the plurality of photo-charges are accumulated in the at least one photodiode.

2. The image sensor of claim 1, wherein the row driver is configured to apply the first bulk control voltage having the negative level to the bulk area of the first pixel in a third period in which a signal of the first pixel is output.

3. The image sensor of claim 2, wherein the row driver is configured to apply the first bulk control voltage to the bulk area of the first pixel in a section of the third period in which the selection transistor of the first pixel is turned on.

4. The image sensor of claim 1, wherein the row driver is configured to apply the second bulk control voltage to the bulk area of the first pixel in a third period in which a signal of the first pixel is output.

5. The image sensor of claim 1, wherein the row driver is configured to vary a voltage level of a second transmission control signal applied to the transmission transistor of the first pixel, according to a voltage level of the bulk control voltage applied to the bulk area of the first pixel.

6. The image sensor of claim 1, further comprising a voltage application circuit configured to apply a preset negative voltage to the device isolation structure of the first pixel.

7. The image sensor of claim 6, wherein the row driver is configured to control, in one of the preset periods, a difference between a level of the negative voltage applied to the device isolation structure of the first pixel and a level of a voltage applied to the bulk area of the first pixel by adjusting the bulk control voltage.

8. The image sensor of claim 1, wherein the bulk control voltage comprises the negative voltage or a voltage of 0 V.

9. A pixel, comprising:
at least one photodiode, a transmission transistor, and a selection transistor,
wherein a first bulk control voltage is applied to a first terminal of the at least one photodiode in an operation cycle comprising a readout operation, and a second bulk control voltage is applied to the first terminal of the at least one photodiode in an entire vertical blank period in which a plurality of photo-charges are accumulated in the at least one photodiode.

10. The pixel of claim 9, wherein the first bulk control voltage is applied to the first terminal of the at least one photodiode in a first period in which a first transmission control signal is transmitted to the transmission transistor to initialize the at least one photodiode, and the second bulk control voltage is applied to the first terminal of the at least one photodiode in a second period in which a plurality of photo-charges are accumulated in the at least one photodiode.

11. The pixel of claim 9, wherein, in a third period in which a signal of the pixel is output, the first bulk control voltage is applied to the first terminal of the at least one photodiode.

12. The pixel of claim 11, wherein the first bulk voltage is applied to the first terminal of the at least one photodiode when the selection transistor is turned on during the third period.

13. The pixel of claim 9, wherein, in a third period in which a signal of the pixel is output, the second bulk control voltage is applied to the first terminal of the at least one photodiode.

14. The pixel of claim 9, wherein the first bulk control voltage is a negative voltage, and the second bulk control voltage is a voltage of 0 V.

15. An operating method of an image sensor, the operating method comprising:
applying a first bulk control voltage to a bulk area in a first period in which a photodiode of a pixel is initialized, wherein the first bulk control voltage has a negative voltage level and controls a negative voltage level applied to a device isolation structure and a voltage level applied to the bulk area in the pixel;
applying a second bulk control voltage to the bulk area in a second period in which a plurality of photo-charges are accumulated in the photodiode, wherein the second bulk control voltage is applied for the entire time the plurality of photo-charges are accumulated in the photodiode; and
applying the first bulk control voltage to the bulk area in a third period in which a signal of the pixel is output.

16. The operating method of claim 15, wherein, when a selection transistor is turned on in the third period, the first bulk control voltage is applied to the bulk area.

17. The operating method of claim 15, wherein the second bulk control voltage is applied to the bulk area in the third period.

18. The operating method of claim 15, wherein a voltage level of a transmission control signal transmitted to a transmission transistor varies according to a level of a bulk control voltage applied to the bulk area.

* * * * *